United States Patent [19]

Amaratunga et al.

[11] Patent Number: 5,489,787
[45] Date of Patent: Feb. 6, 1996

[54] SEMICONDUCTOR DEVICE HAVING AN INSULATED GATE FIELD EFFECT TRANSISTOR AND EXHIBITING THYRISTOR ACTION

[75] Inventors: Gehan A. Amaratunga; Florin Udrea, both of Cambridge, United Kingdom

[73] Assignee: U.S. Philips Corporation, New York, N.Y.

[21] Appl. No.: 271,407

[22] Filed: Jul. 6, 1994

[30] Foreign Application Priority Data

Jul. 5, 1993 [GB] United Kingdom .................. 9313843

[51] Int. Cl.$^6$ .......................... H01L 29/74; H01L 31/111
[52] U.S. Cl. .......................... 257/137; 257/132; 257/133; 257/331; 257/332; 257/335
[58] Field of Search .................................. 257/132, 133, 257/137, 146, 330, 331, 332, 335

[56] References Cited

U.S. PATENT DOCUMENTS

| | | | |
|---|---|---|---|
| 4,969,028 | 11/1990 | Baliga | 357/38 |
| 5,202,750 | 4/1993 | Gough | 257/133 |
| 5,319,221 | 6/1994 | Ueno | 257/137 |
| 5,321,281 | 6/1994 | Yamaguchi et al. | 257/137 |

FOREIGN PATENT DOCUMENTS 1587773  4/1981  United Kingdom .

OTHER PUBLICATIONS

"MOS Controlled Thyristors–A New Class of Power Devices" V. Temple, IEEE Transactions on Electron Devices vol. ED–33, No. 10, Oct. 1986.

*Primary Examiner*—Ngán Ngó
*Attorney, Agent, or Firm*—Steven R. Biren

[57] ABSTRACT

An insulated gate field effect device (1a,1b,1c,1d) has a semiconductor body (2) with a first region (3) of one conductivity type, a second region (4) of the opposite conductivity type, a third region (6) of the one conductivity type (7) separated from the first region (3) by the second region (4) and at least one injector region (8) for injecting charge carriers of the opposite conductivity type into the first region (3). The conduction channel area (40) adjoining the insulated gate (9, 10) has first and second subsidiary areas (40 and 40b) for providing respective first and second subsidiary conduction channels. The second subsidiary area (40b) is spaced from the third region (6) and is more lowly doped than the first subsidiary conduction channel area (40a) for causing, when the injected opposite conductivity current type reaches a given value, the pn junction (40b') between the second subsidiary channel (40b) and the second region (4) to become forward-biassed causing the bipolar transistor formed by the second subsidiary channel (40b), the second region (4) and the first region (3) to conduct to initiate with the at least one injector region (8) thyristor action which ceases upon removal of the conduction channel.

14 Claims, 4 Drawing Sheets

5,489,787

SEMICONDUCTOR DEVICE HAVING AN INSULATED GATE FIELD EFFECT TRANSISTOR AND EXHIBITING THYRISTOR ACTION

BACKGROUND OF THE INVENTION

This invention relates to a semiconductor device comprising an insulated gate field effect transistor.

In particular, this invention relates to a semiconductor device comprising an insulated gate field effect device having a semiconductor body comprising a first region of one conductivity type, a second region of the opposite conductivity type forming a first pn junction with the first region, a third region of the one conductivity type forming a second pn junction with the second region and being separated from the first region by the second region, at least one injector region for injecting charge carriers of the opposite conductivity type into the first region, an insulated gate, a conduction channel area within the second region and adjoining the insulated gate, which conduction channel area is gateable by the insulated gate between a first state in which a conduction channel of the one conductivity type provides a conductive path for the flow of charge carriers of the one conductivity type between the first and third regions and a second state in which the conduction channel is removed, the device being such that initiation of thyristor action by the transistors formed by the first, second and third regions and the injector, first and second regions is inhibited.

Such an insulated gate field effect device is generally now known as an insulated gate bipolar transistor (IGBT) or sometimes an insulated gate transistor (IGT). This and other types of combined MOS and bipolar devices are described in a paper entitled "Evolution of MOS-Bipolar Power Semiconductor Technology" by B. Jayant Baliga published in the Proceedings of the IEEE Volume No. 76, April 1988 at pages 409 to 418.

An insulated gate bipolar transistor (IGBT) differs from a conventional insulated gate field effect transistor in that, in the case of an enhancement type device, in the on-state in addition to the current of the one conductivity type provided by carriers of the one conductivity type flowing along the inversion channel induced by the first voltage applied to the insulated gate structure, a current of the opposite conductivity type is provided by the injection of opposite conductivity type carriers into the first region by the injector region. This injection of opposite conductivity type carriers into the first region reduces the on-resistance of the device in comparison to that of a similar construction conventional insulated gate field effect transistor or MOSFET. As indicated by Baliga, the IGBT exhibits the desirable features of a MOSFET, namely voltage controlled operation and high output impedance as well as the desirable features of bipolar devices namely high forward conduction density albeit at the price of a reduced switching speed compared to conventional MOSFETS.

The IGBT has advantages over the earlier MOS-gated thyristor in that, unlike the MOS-gated thyristor, the IGBT can still be easily controlled by a voltage applied to the insulated gate structure after the device has been turned on. In an attempt to make the MOS-gated thyristor more controllable, the MOS-controlled thyristor (MCT) was devised in which, as described by Baliga, a second insulated gate field effect device structure or MOS is used to turn off the thyristor.

Compared to the MCT, the IGBT has been found to have an improved controllable current capability and safe operating area (SOA). However, the on-resistance of the IGBT is in comparison higher because of the potential drop along the conduction channel and because of less than effective conductivity modulation of the first or drift region. Moreover, the necessity to avoid breakdown by punch through when the IGBT is operating in a reverse voltage blocking mode limits the degree to which the conduction channel length and the dopant concentration of the second region can be reduced. Accordingly, the on-state or conducting performance of the IGBT has generally been found to be inferior to that of the MCT.

As indicated above the MCT requires a first turn-on and a second separate turn-off insulated gate field effect device or MOS structure. In order to achieve turn-off of the thyristor, the second MOS structure is rendered conducting by applying the appropriate voltage to its insulated gate so that charge carriers have an alternative path to the cathode electrode by-passing the cathode junction. However, the thus-diverted current tends to forward bias the cathode junction and so to maintain thyristor action. Accordingly in the MCT it is necessary to make the resistance of the turn-off MOS conduction channel so low that the voltage across it is less than the potential barrier (0.7 V) of the cathode junction and is thus insufficient to maintain thyristor action. Although theoretically this condition can be achieved, the turn-off process of the MCT has been found to be difficult to control for high current densities.

SUMMARY OF THE INVENTION

It is an aim of the present invention to provided a semiconductor device comprising an insulated gate field effect device which exhibits an on-resistance which is reduced in comparison to that of an IGBT but which still enables controllable turn-off by the insulated gate structure.

According to the present invention, there is provided a semiconductor device comprising an insulated gate field effect device having a semiconductor body comprising a first region of one conductivity type, a second region of the opposite conductivity type forming a first pn junction with the first region, a third region of the one conductivity type forming a second pn junction with the second region and being separated from the first region by the second region, at least one injector region for injecting charge carriers of the opposite conductivity type into the first region, an insulated gate, a conduction channel area within the second region and adjoining the insulated gate, which conduction channel area is gateable by the insulated gate between a first state in which a conduction channel of the one conductivity type provides a conductive path for the flow of charge carriers of the one conductivity type between the first and third regions and a second state in which the conduction channel is removed, the device being such that initiation of thyristor action by the transistors formed by the first, second and third regions and the injector, first and second regions is inhibited, characterized in that the conduction channel area comprises first and second subsidiary conduction channel areas for providing respective first and second subsidiary conduction channels in the first state of the conduction channel area, the second subsidiary conduction channel area being spaced from the third region by the first subsidiary conduction channel area and being more lowly doped than the first subsidiary conduction channel area for causing, when the current resulting from the injection of charge carriers of the opposite conductivity type by the at least one injector region reaches a given value in operation of the device, the pn junction between the second subsidiary conduction channel and the second region to become forward biased causing the bipolar transistor formed by the second subsidiary conduction channel, the second region and the first region to conduct to initiate with the at least one injector region thyristor action which ceases upon removal of the conduction channel.

Thus in a device in accordance with the invention initially the insulated gate field effect device operates like an IGBT. However as the current of opposite conductivity type carriers injected by the at least one injector region increases through the relatively lowly doped second subsidiary region of the second region the voltage across the pn junction between the second subsidiary conduction channel and the second region will rise to 0.7 V causing this pn junction to become forward-biassed resulting in the injection of charge carriers of the one conductivity type into the second region so turning on the bipolar transistor formed by the second subsidiary inversion channel, the second region and the first region and thus initiating thyristor action with the at least one injector region.

As will be appreciated, the second subsidiary inversion channel also forms the emitter of the thyristor and is only present in the first state that is when the conduction channel is present, and accordingly when the conduction channel is removed the thyristor action cannot be maintained. Accordingly, turn-off of the device is readily controlled by the insulated gate.

The second region may comprise first and second subsidiary regions adjoining the insulated gate for providing the first and second conduction channel areas in which respective first and second subsidiary inversion channels are formed in the first state of the conduction channel area.

Generally, the second subsidiary region is separated from the first region by a third subsidiary region of the second region which is more highly doped than the second subsidiary region. The inclusion of such a third subsidiary region means that the doping of the first and second subsidiary regions can be reduced to as low a value as considered desirable without having to worry about the possibility of punch-through to the first region occurring.

The third region may be electrically shorted to the first subsidiary region of the second region to inhibit forward-biassing of the second pn junction between the third and second regions which could otherwise result in thyristor action between the third, second, first and injector regions and also to provide a good conductive path for extraction of charge carriers of the opposite conductivity type during turn-off of the device.

The third and injector regions may meet a first one of first and second major surfaces of the semiconductor body so that the insulated gate field effect device forms a so-called lateral device in which the major current flow is in a direction parallel, or nearly so, to the major surfaces of the semiconductor body.

Alternatively, the third and injector regions may meet respective ones of first and second major surfaces of the semiconductor body so that the insulated gate field effect device forms a so-called vertical device in which the major current flow is between the first and second major surfaces.

In one example the second and third pn junctions may meet a first one of two opposed major surfaces of the semiconductor body so that the conduction channel area adjoins the first major surface and the insulated gate structure extends on the first major surface over the conduction channel area to form a so-called planar device.

In another example, the third region may meet a first one of two opposed major surfaces of the semiconductor body and the insulated gate structure may be formed within a groove extending from the first major surface through the third and second regions into the first region. This has advantages for so-called vertical devices because, in comparison to a planar structure, prior to thyristor initiation the entire current of opposite conductivity type carriers flows between the first and second major surfaces generally parallel to the inversion channel increasing the potential in the region of the inversion channel and in particular in the second subsidiary region of the second region and so facilitating thyristor initiation. A similar geometrical current distribution and this advantage occurs with a so-called planar geometry where the device is a lateral rather than a vertical device. In both cases once thyristor action is initiated, the effective length of the conduction channel is reduced and the first region is highly modulated by thyristor action and thus the current density for a given second voltage is increased.

Where the insulated gate field effect device is intended to be a power device it will generally be formed of many (typically hundreds or thousands) of third regions formed in a common first region with a common insulated gate structure. In such a case, a vertical configuration may have advantages in allowing for a higher current carrying capability.

The present invention also provides a semiconductor device comprising an insulated gate field effect device having a semiconductor body comprising a first region of one conductivity type, a second region of the opposite conductivity type forming a first pn junction with the first region, a third region of the one conductivity type forming a second pn junction with the second region and being separated from the first region by the second region, an insulated gate, a conduction channel area within the second region and adjoining the insulated gate, which conduction channel area is gateable by the insulated gate between a first state in which a conduction channel of the one conductivity type provides a conductive path for the flow of charge carriers of the one conductivity type between the first and second regions and a second state in which the conduction channel is removed, the device being such that initiation of bipolar transistor action by the first, second and third regions is inhibited, characterised in that the conduction channel area comprises first and second subsidiary conduction channel areas for providing respective first and second subsidiary conduction channels in the first state of the conduction channel area, the second subsidiary conduction channel area being spaced from the third region by the first subsidiary conduction channel area and being more lowly doped than the first subsidiary conduction channel area for causing, when a leakage current of charge carriers of the opposite conductivity type across the first pn junction reaches a given value in operation of the device, the pn junction between the second subsidiary conduction channel and the second region to become forward-biassed causing the bipolar transistor formed by the second subsidiary conduction channel, the second region and the first region to conduct to initiate bipolar transistor action which ceases upon removal of the conduction channel. Generally the third and first regions in this case form the source and drain of an MOS transistor. Such a device initially acts as a MOS transistor but with increasing drain voltage the bipolar transistor formed by the second subsidiary conduction channel, the second region and the first region switches on. This bipolar transistor can however be readily switched off by the insulated gate because in the absence of the conduction channel there is no emitter for the bipolar transistor.

BRIEF DESCRIPTION OF THE DRAWING

Embodiments of the invention will now be described by way of example with reference to the accompanying drawing, in which.

It should of course be understood that FIGS. 1 and 5 to 7 are not to scale and that relative dimensions such as the thicknesses of layers or regions may have been exaggerated in the interests of clarity. Like reference numerals are used throughout to refer to like parts.

DESCRIPTION OF THE PREFERRED EMBODIMENTS

Figure 1:
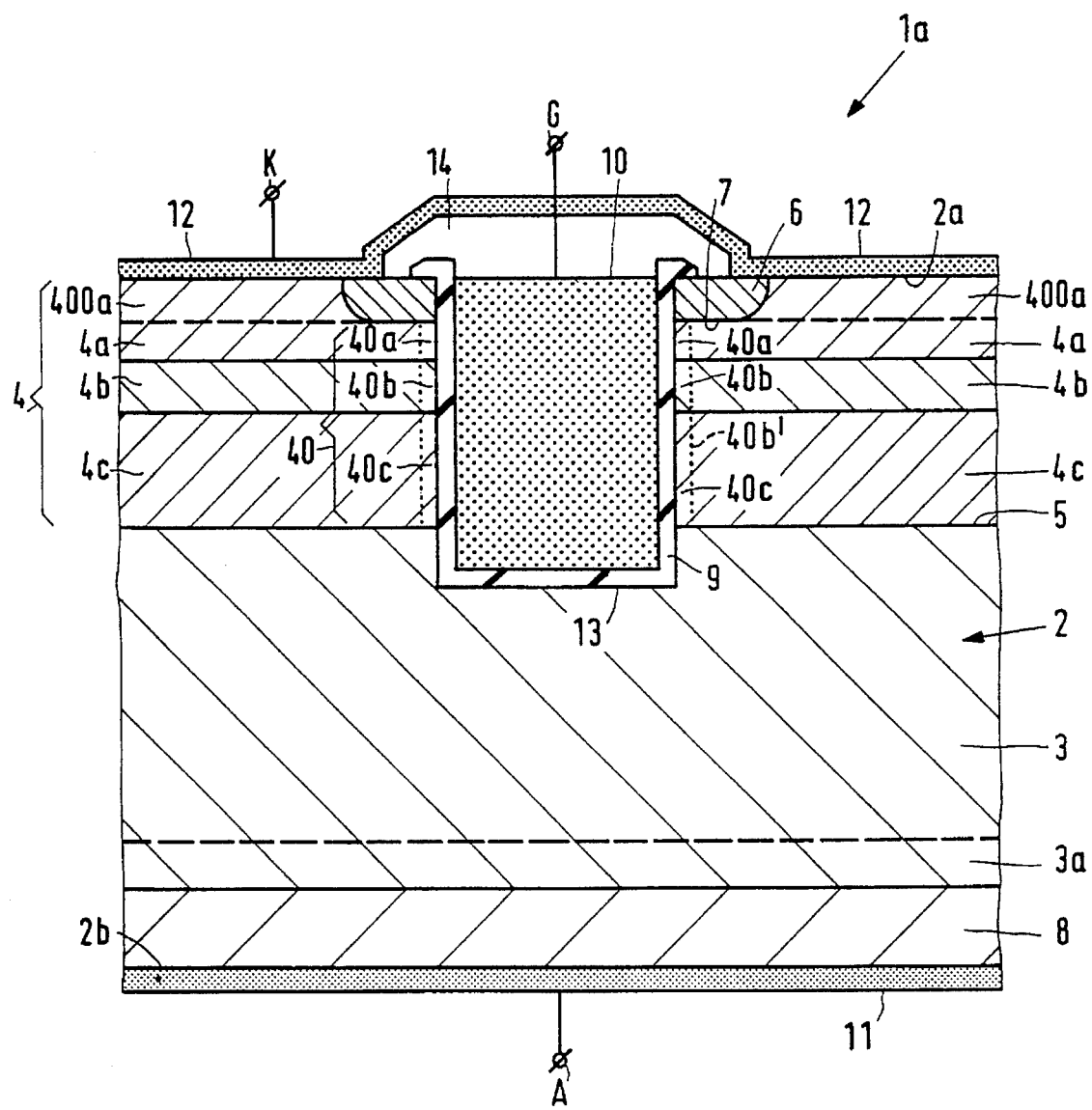
FIG. 1 is a schematic cross-sectional through part of a first embodiment of a semiconductor device comprising an insulated gate field effect device in accordance with the invention.

Referring now to the drawings, especially FIGS. 1, 5, 6 and 7 there is illustrated a semiconductor device comprising an insulated gate field effect device $1a,1b,1c,1d$ having a semiconductor body 2 comprising a first region 3 of one conductivity type, a second region 4 of the opposite conductivity type forming a first pn junction 5 with the first region 3, a third region 6 of the one conductivity type forming a second pn junction 7 with the second region 4 and being separated from the first region 3 by the second region 4, at least one injector region 8 for injecting charge carriers of the opposite conductivity type into the first region 3, an insulated gate 9, 10, a conduction channel area 40 within the second region 4 and adjoining the insulated gate 9, 10, which conduction channel area 40 is gateable by the insulated gate 9, 10 between a first state in which a conduction channel of the one conductivity type provides a conductive path for the flow of charge carriers of the one conductivity type between the first and third regions and a second state in which the conduction channel is removed, the device being such that initiation of thyristor action by the transistors formed by the first, second and third regions 3, 4 and 6 and the injector, first and second regions 8, 3 and 4 is inhibited.

In accordance with the invention the conduction channel area 40 comprises first and second subsidiary conduction channel areas 40a and 40b for providing respective first and second subsidiary conduction channels in the first state of the conduction channel area 40, the second subsidiary conduction channel area 40b being spaced from the third region 6 by the first subsidiary conduction channel area 40a and being more lowly doped than the first subsidiary conduction channel area 40a for causing, when the current resulting from the injection of charge carriers of the opposite conductivity type by the at least one injector region 8 reaches a given value in operation of the device, the pn junction 40b' between the second subsidiary conduction channel 40b and the second region 4 to become forward-biassed causing the bipolar transistor formed by the second subsidiary conduction channel 40b, the second region 4 and the first region 3 to conduct to initiate with the at least one injector region 8 thyristor action which ceases upon removal of the conduction channel Thus, in a semiconductor device in accordance with the invention, in operation the insulated gate field effect device initially turns on in an IGBT-like manner. However, as the current of opposite conductivity carriers provided by the injector region 8 through the second region 4 increases, the potential difference across the pn junction 40b' between the second subsidiary conduction channel and the second region 4 of the second region 4 rises until at 0.7 V it is sufficient to forward bias the pn junction 40b' causing the second subsidiary conduction channel in the second subsidiary conduction channel area 40b to act as a bipolar emitter injecting carriers of the one conductivity type into the second region 4 and so turning on the bipolar transistor formed by the second conduction channel 40b, the second region 4 and the first region 3. This initiates thyristor action with the injector region 8. Once injection from the second subsidiary inversion channel starts and thyristor action is initiated, the carriers of the one conductivity type flow through the thyristor so by-passing part of the conduction channel and thus effectively reducing the total length of the conduction channel to close to the length of the first subsidiary conduction channel area 40a, so reducing the channel series resistance.

Unlike an MCT, however, thyristor action in an insulated gate field effect device in accordance with the invention is readily controllable and can be stopped simply by removing the conduction channel because in the absence of the conduction channel there is no emitter for the thyristor. Thus, the turn-on and turn-off mechanisms and performances of the device are similar to those of an IGBT while the on-state mechanism and performance are closer to those of an MCT.

FIG. 1 illustrates a first example of a semiconductor device in accordance with the invention.

In the example illustrated in FIG. 1, the semiconductor body comprises a monocrystalline silicon substrate which forms the injector region 8 and is relatively highly doped with impurities of the opposite conductivity type, p conductivity type in this example, to provide, typically, a resistivity of 0.01 ohm-cm on which the first or drift region 3 is formed as a relatively lowly doped epitaxial layer of the one conductivity type (n conductivity type in this example). The doping and thickness of this layer 3 will depend upon the desired reverse voltage blocking capability of the device but typically the first region 3 may have a dopant concentration of $10^{14}$ ions cm$^{-3}$ and a thickness of 60 to 100 μm (micrometers).

If desired, a more heavily doped layer (shown by the dashed line 3a in FIG. 1) of the one conductivity type may be provided as a buffer layer between the injector region 8 and the first or drift region 3 to moderate the injection into the drift region 3 from the injector region 8. Typically the buffer layer 3a may have a dopant concentration of $10^{17}$ ions cm$^{-3}$ and a thickness of 2 μm.

As an alternative where a very high voltage device is required, then the first or drift region 3 may be a lowly doped monocrystalline substrate with the injector region 8 (and buffer layer 3a if provided) formed by implantation and/or diffusion or, rarely, by epitaxial deposition. Although not shown, as described in U.S. Pat. No. 4,969,028 an anode-shorted arrangement may be adopted in which a number of spaced-apart injector regions are formed in a relatively highly doped layer of the one conductivity type.

In this example the drift region 3 provides one major surface 2a and the substrate or injector region 8 provides the other major surface 2b of the semiconductor body 2.

The second region 4 is in this case formed by blanket diffusion and/or implantation of impurities of the opposite conductivity type, generally boron ions, into the first region 3, although it would of course be possible to form the second region 4 epitaxially.

The second region 4 comprises in this example first, second and third subsidiary regions 4a, 4b and 4c. A relatively highly doped layer 4c of the opposite conductivity type, p conductivity type in this case forms the third subsidiary region of the second region 4. Typically the third subsidiary region 4c has a doping concentration in the range of from $10^{16}$ ions cm$^{-3}$ to $10^{17}$ ions cm$^{-3}$ and a thickness in the range of from 2 μm to 3 μm where the desired reverse voltage blocking capability or rating is in the range of from 600 to 1500 volts.

The second subsidiary region 4b is formed as a relatively lowly doped player on the third subsidiary region 4c and may have a doping concentration in the range of form $10^{14}$ ions cm$^{-3}$ to $10^{15}$ ions cm$^{-3}$. The thickness of this layer 4b should be sufficient to provide sufficient injection from the associated inversion layer 40b during thyristor operation as will be explained below and may typically be 2 μm.

The first subsidiary region 4a is formed as a layer of p conductivity type which is more highly doped than the second subsidiary region 4b. The first subsidiary region 4a may have a Gaussian doping profile with a doping concentration of $10^{19}$ ions cm$^{-3}$ at the surface 2a and a thickness in the range of from 1 to 1.5 μm. As an alternative the first subsidiary region 4a may have a uniform doping profile in the range of, typically, from $10^{16}$ ions cm$^{-3}$ to $10^{17}$ ions cm$^{-3}$. In such a case, however, an additional relatively highly doped p conductivity type surface layer 400a (indicated by the dashed line in FIG. 1) with a dopant concentration in the region of $10^{19}$ ions cm$^{-3}$ should be provided to facilitate ohmic contact by the second main electrode 12 to inhibit forward-biasing of the pn junction 7. This forward-biasing could also be inhibited by etching a trench through the surface layer 400 so that the second main electrode 12 makes contact to the second region 4 below the third region 6 so that no hole current flows beneath the third region 6.

In this example, the third region 6 is formed as a planar region by use of conventional masking and implantation technology. The third region 6 is relatively highly doped with impurities of the one conductivity type, n conductivity type in this case for example arsenic or phosphorus ions, and typically has a surface dopant concentration of $10^{20}$ ions cm$^{-3}$ and a junction depth in the range of from 0.5 to 1 μm. As will be seen below, the difference in thicknesses or depths of the third region 6 and the first subsidiary region 4a defines the effective channel length which should be in the region of less than a micrometer typically 0.5 μm.

In this example, the insulated gate structure 9, 10 is formed by defining a groove 13 which extends through the third and second regions 6 and 4 into the first region 3.

Typically the groove 13 is in the range of from 5 to 8 μm deep. A gate oxide layer 9 with a typical thickness of 0.08 μm is formed on the surface of the groove 13 which is then filled with gate conductive material, generally doped polycrystalline silicon, to define the gate conductive region 10.

The insulated gate structure 9, 10 adjoins the conduction channel area 40 provided by the second region 4. In this example, the conduction channel area 40 consists in series of first, second and third subsidiary conduction channel areas 40a, 40b and 40c provided by the first, second and third subsidiary regions 4a, 4b and 4c, respectively.

An insulating layer is provided over the one major surface 2a and patterned using conventional techniques to define an insulating region 14 over the insulated gate structure to enable the insulated gate structure 9, 10 to be electrically isolated from the second main electrode 12. Metallization, generally aluminium, is deposited to provide a first main electrode 11 (the anode electrode A in this case) on the major surface 2b. Metallization is also deposited and patterned to define a second main electrode 12 which forms a cathode electrode K in ohmic contact with the third region 6 and to define (via a contact window which is not shown) a gate electrode G contacting the insulating gate structure 9, 10. The cathode electrode K electrically shorts the first subsidiary region 4a to the third region 6 to inhibit parasitic bipolar action therebetween.

The geometry, doping and thickness of the first, second, third and injector regions 3, 4, 6 and 8 are selected such that thyristor action by these four regions is inhibited. Thus, the gains of the two parasitic bipolar transistors formed by the injector region 8, first region 3 and second region 4 and by the third region 6, the second region 4 and the first region 3 when combined add up to less than one (unity).

Generally, if the insulated gate field effect device is to be a power device then a number (typically hundreds or thousands) of parallel-connected cells will be provided with each cell consisting of, in this example, simply a third region 6 with the third regions 6 arranged in a regular array in a common second region 4. In such a case the respective insulated gate structures 9, 10 are joined together by forming the groove as a regular grid-like trench. The grid-like trench may have, for example, a rectangular or hexagonal shape (as shown in U.S. Pat. No. 5,072,266). A strip-like geometry could alternatively be adopted but a cellular or grid-like geometry should provide for a higher packing density and a hexagonal cellular structure in particular should allow a higher conduction channel area 40 density.

In operation of the n-channel enhancement mode device 1a shown in FIG. 1, a first positive voltage is applied by the gate electrode G to the insulated gate structure 9, 10 to cause an inversion channel to be formed in the conduction channel area 40 of the second region 4 and a second voltage is applied between the cathode and anode electrodes A and K.

The inversion channel allows electrons to be injected from the third or cathode region 6 into the first or drift region 3 while the injector or anode region 8 causes holes to be injected into the drift region 3. As in the case of an IGBT the device 1a will remain in the on-state (that it is will remain conducting) until the first voltage is removed from the gate electrode G. However, in contrast to the IGBT, in a device in accordance with the invention, two distinct modes of operation occur in the on-state.

Figure 2:
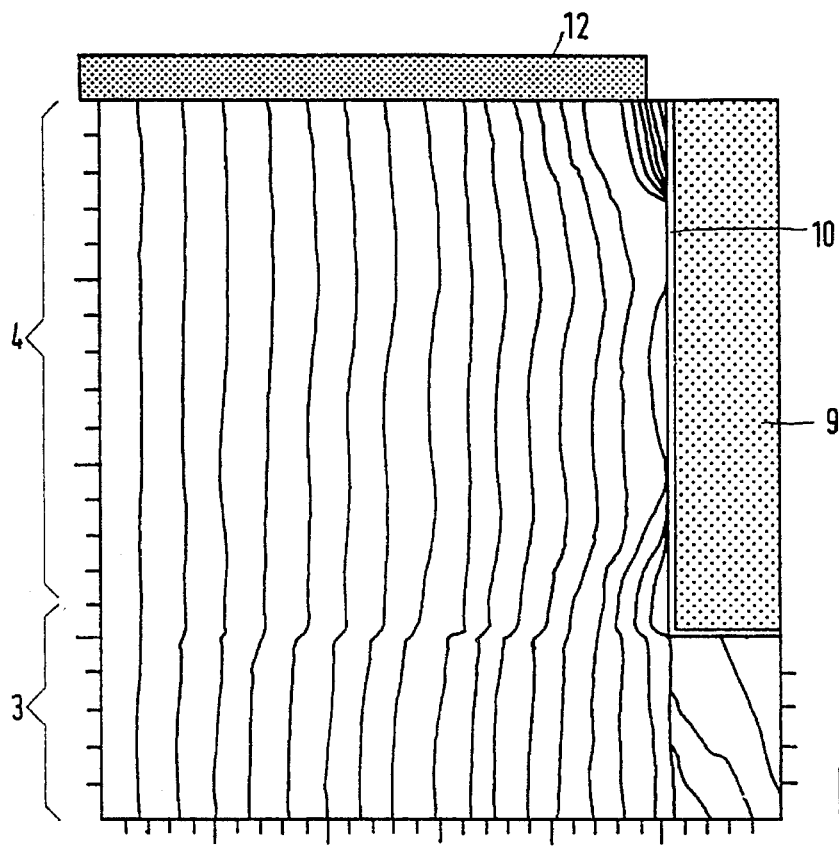
FIG. 2 illustrates the simulated current distribution in a device as shown in FIG. 1 during part of its operation.
Figure 3:
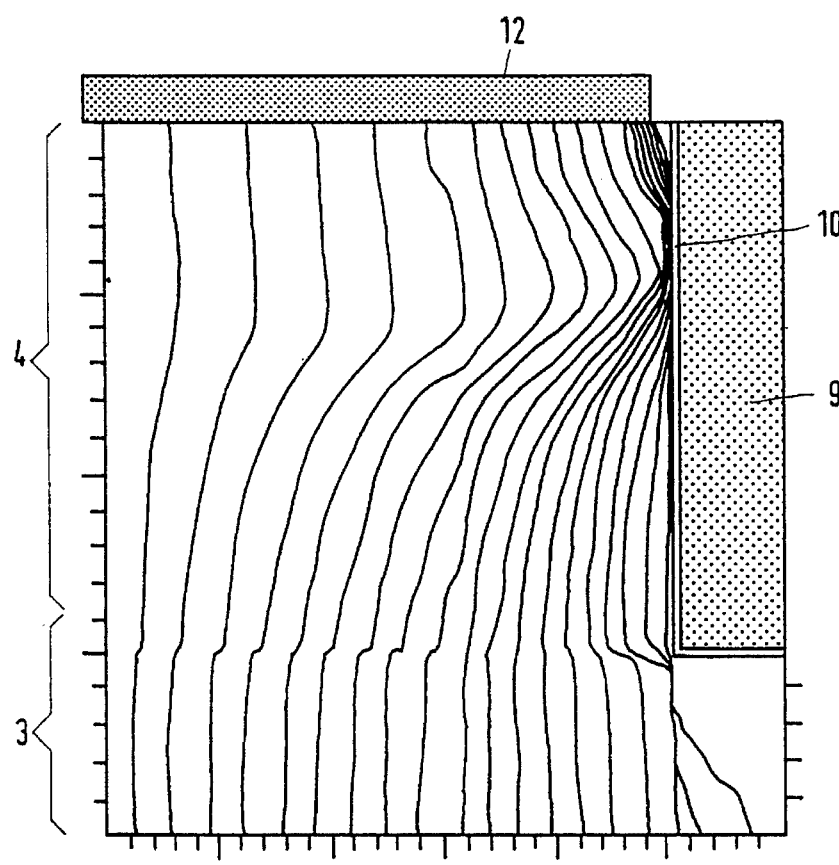
FIG. 3 illustrates the simulated current distribution in a device as shown in FIG. 1 during another part of its operation.

Thus, initially the electron current flows through the inversion channel 40 formed in the series of first, second and third subsidiary conduction channel areas 40a, 40b and 40c into the drift region 3 while the hole current flows from the injector or anode region 8 through the drift region 3 and second region 4 to the cathode electrode K. FIG. 2 illustrates a computer simulation of the current distribution in this mode for a device of the type described with reference to FIG. 1 and having an off-state voltage rating of 600 V where the second voltage across the anode and cathode electrodes A and K is 0.9 V.

As the anode current increases, the very low conductivity of the second subsidiary region 4b causes the difference between the hole quasi Fermi potential in the second subsidiary region 4b and the electron quasi Fermi potential in the inversion channel in the second subsidiary conduction channel area 40b to become greater than the voltage barrier 0.7 V between the inversion channel 40b and the second subsidiary region 4b causing the associated pn junction 40b' to become forward-biassed resulting in electrons being injected into the second subsidiary region 4b and so turning on the distributed NPN bipolar transistor defined by the inversion channel 40b acting as the emitter, the second subsidiary region 4b acting as the base and the drift region 3 acting as the collector leading with the injection from the anode region 8 to thyristor action.

Although both the emitter/base and base/collector pn junctions of this distributed NPN transistor are connected by the subsidiary inversion channel 40c formed in the third subsidiary region 4c, the fraction of the electron current flowing through the subsidiary inversion channel 40c is negligible because of the relatively high resistance provided by the path through the subsidiary inversion channel 40c. Consequently, both the second subsidiary region 4b and the drift region 3 are highly modulated by mobile carriers and at this stage the device 1a functions in a combined IGBT-thyristor mode as illustrated by the computer simulation derived for the device of FIG. 1 with an anode voltage of 1.6 volts. Thus, as in a IGBT, the main fraction of the hole current flows through the second region 4 to the cathode electrode K while, as in a thyristor structure, the pn junction 40b' formed between the inversion channel 40b and the second subsidiary region 4b and the pn junction 5 between the third subsidiary region 4c and the drift region 3 are both forward-biassed (because under high injection the npn (regions 40b, 4b, 3) transistor is saturated) allowing the thyristor current to flow through the entire thyristor structure bypassing the inversion channels 40b and 40c. The effective length of the inversion channel is thus reduced to that of the subsidiary inversion channel 40a.

The relatively highly doped third subsidiary region 4c serves to prevent punch-through between the third and first regions 6 and 3 when the device is in a reverse voltage blocking condition (that is when no gate voltage is applied so enabling the doping concentration within the second subsidiary region 4b and the channel length to be as low as desired without having to worry unduly about punch-through problems. This enables, on the assumption that first subsidiary region 4a is highly conductive to inhibit injection at the pn junction 7, the length and the impurity concentration level of the first and second subsidiary conduction channel areas 40a and 40b to be substantially reduced provided that the second subsidiary region 40b can still provide sufficient electron injection for thyristor action.

As the second or anode voltage increases, the current density tends to saturate because of, for example, the decrease in carrier mobility in the inversion channel, pinch-off effects due to the saturation of the MOS transistor (whose channel region is provided by the inversion channel 40a and some of 40b) as the effective MOS drain voltage increases with the anode voltage. However, the device remains in the on-state for as long as an appropriate first voltage is applied to the gate electrode G.

Turn-off of the device 1a is achieved by interrupting or removing the positive first voltage from the gate electrode G. This causes the collapse of the inversion channel and thus the removal of the thyristor emitter. During turn-off the holes are extracted through the second region 4 to the cathode electrode K and any remaining excess injected carrier charge decreases with time by recombination.

Figure 4:
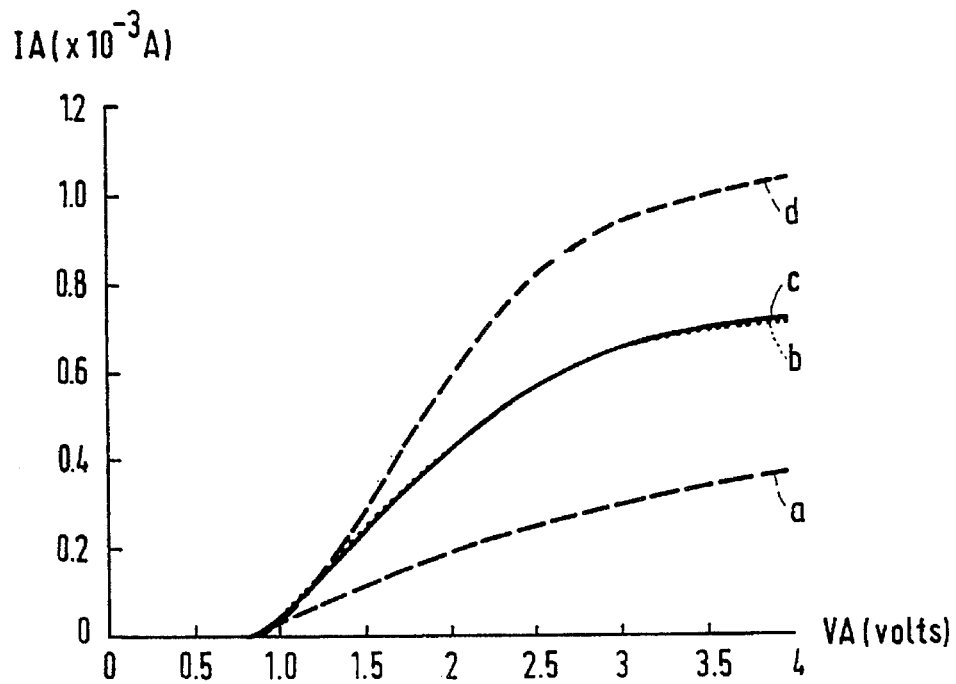
FIG. 4 illustrates the anode current (IA) versus anode voltage (VA) characteristics for devices as shown in FIG. 1 and for conventional trench gate IGBTS.

FIG. 4 illustrates computer simulations of the anode current (IA) versus anode voltage (VA) characteristics for two devices 1a having the structure described above with reference to FIG. 1 but with different effective channel lengths (where the effective channel length is the difference in depth below the surface 2a of the regions 6 and 4a) and a doping concentration in the second subsidiary region 4b of $10^{14}$ ions cm$^{-3}$ and two conventional trench gate IGBTs having a constant doping ($10^{17}$ ions cm$^{-3}$) second region 4. In each case the gate or first voltage Vg is 15 volts.

Line a illustrates the characteristic for a long channel trench IGBT which may have an off-state blocking voltage of 600 volts, line b illustrates the characteristic for a short channel (0.5 μm) trench IGBT having a much lower off state blocking voltage than the trench IGBT illustrated by line a, line c illustrates the characteristic for a short channel (0.5 μm) device 1a in accordance with FIG. 1 and having an off-state blocking voltage of 600 volts and line d illustrates the characteristic for a very short channel (0.2 μm) device 1a in accordance with FIG. 1 and with an off-state blocking voltage equivalent to that of the device represented by line c. As can be seen from FIG. 4, a very significant increase in current density compared to a IGBT and a characteristic very close to a thyristor characteristic can be achieved with a device in accordance with FIG. 1.

The simulations have shown that a device as described above and shown in FIG. 1 has turn off characteristics virtually identical to those of a corresponding comparable conventional trench IGBT in which, as discussed above, the second region 4 is of constant doping. A turn-off time of about 1.8 microseconds for the device shown in FIG. 1 has been estimated.

Figure 5:
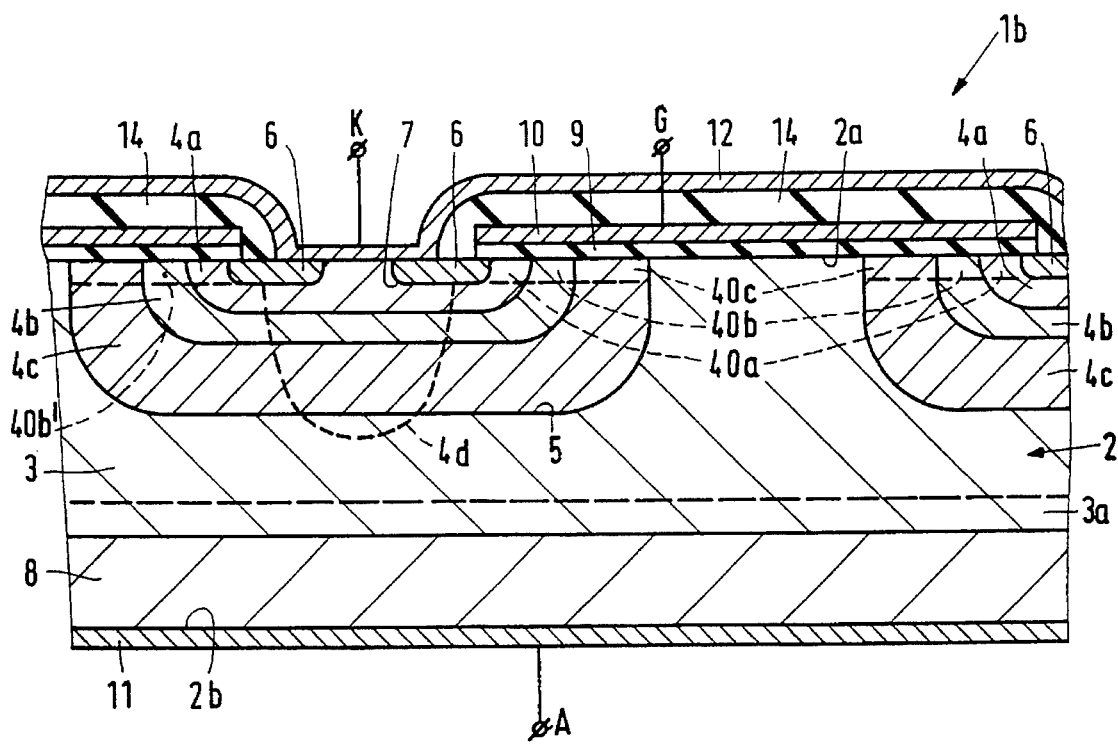
FIG. 5 is a schematic cross-sectional through part of a second embodiment of a semiconductor device comprising an insulated gate field effect device in accordance with the invention.

The device 1a shown in FIG. 1 could be modified by being manufactured using planar technology by analogy with conventional IGBT structures as shown in, for example, U.S. Pat. No. 4,364,073. FIG. 5 illustrates a cross-sectional view through such a planar device 1b.

As will be appreciated by those skilled in the art, the device 1b differs from the device 1a in that the third, second and first subsidiary regions 4a, 4b and 4a of the second region 4 and the third region 6 are all formed as planar regions each meeting the major surface 2a and the insulated gate structure 9, 10 is formed over the conduction channel area 40 on the major surface 2a. This structure may be formed by analogy with standard DMOSFET processing by introducing the impurities 1a form the third, second and first subsidiary regions 4c, 4b and 4c of the second region 4 and the third regions 6 using the insulated gate structure as a mask. In order to enable shorting between the third regions 6 and the second regions 4 to inhibit the undesired thyristor action discussed above, the central area of each cell may be masked from the introduction of the impurities to form the third regions as shown in FIG. 5 or alternatively a moat may be etched in known fashion through the centre of each third region to expose an underlying area of the second region 4 before the metallisation to form the cathode electrode K is deposited. A relatively highly doped central fourth subsidiary region 4d (indicated by dashed lines) of the second region 4 may be formed, as is known to the person skilled in the art of power DMOSFET manufacture, prior to definition of the insulated gate structure 9, 10 to enable ohmic contact to the second region 4 and to inhibit parasitic bipolar action.

The doping, depths and widths of the various regions may be selected as desired bearing in mind that, as indicated above, the gains of the two parasitic bipolar transistors formed by the injector, first and second regions 8, 3 and 4 and by the third, second and first regions 6, 4 and 3 should add up to less than unity. Generally the doping concentrations will be similar to those given above with reference to the device shown in FIG. 1. Again, as in the case of the example shown in FIG. 1 the device 1b may consist of many hundreds or thousands of parallel-connected device cells each in this case consisting of a second region 4 and associated third region 6.

Figure 6:
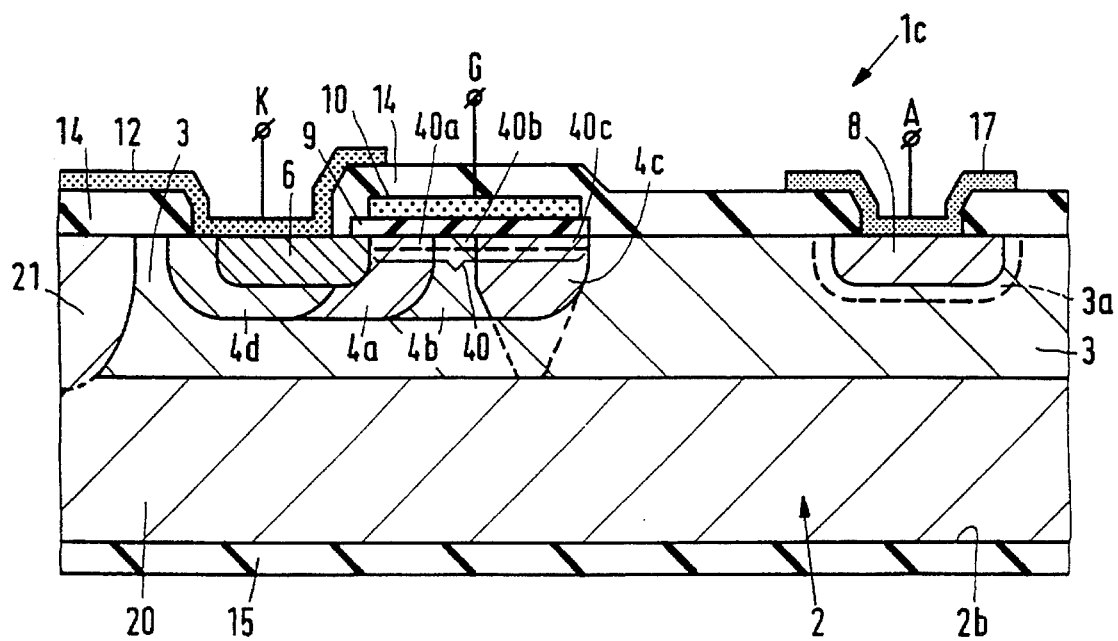
FIG. 6 is a schematic cross-sectional through part of a third embodiment of a semiconductor device comprising an insulated gate field effect device in accordance with the invention.

FIG. 6 illustrates a cross-sectional view through a third example of a device 1c in accordance with the invention.

The device 1c shown in FIG. 6 is a lateral device rather than a vertical device as shown in FIGS. 1 and 5. Thus, in the device structures 1a and 1b shown in FIGS. 1 and 5 the main current path is between the major surfaces 2a and 2b (i.e. in a 'vertical' direction) while in FIG. 6 the main current path is in a direction along or generally parallel to the major surfaces 2a and 2b (i.e. in a 'lateral' direction) because the anode and cathode electrodes A and K are both provided at the one major surface 2a. An insulating or passivating layer 15 may be provided on the other major surface 2b.

The device 1c differs from that shown in FIG. 5 mainly in the provision of the injector region at the major surface 2a rather than at the major surface 2b. In addition because this is a lateral device it is not necessary for relatively lowly doped second subsidiary region 4b to be formed within the relatively highly doped third subsidiary region 4c. Accordingly these various regions may be formed by use of appropriate masking and dopant introduction techniques without having to worry about forming a relatively lowly doped region (that is the second subsidiary region 4b) in a relatively highly doped region (for example the third subsidiary region). To take an example, in such a lateral device, the relatively lowly doped second subsidiary region 4b may be implanted first and then the relatively highly doped subsidiary regions 4a and 4c (and 4d if present) formed by implantation through an appropriate mask.

The device 1c shown in FIG. 6 needs to be isolated from other similar parallel-connected structures which may be formed on the same substrate to form a power device. In the example illustrated this is achieved by pn junction isolation by providing the first or drift region 3 as an epitaxial layer on an opposite (in this case p) conductivity type substrate 20 and by using highly p conductivity doped regions 21 formed using conventional masking, implantation and diffusion techniques to extend through the semiconductor body 2 from the major surface 2a to the substrate 20 to define the drift region 3 as a discrete well. Alternative isolation techniques such as the use of insulating layers or silicon on insulator techniques could be considered.

The various regions shown in FIG. 6 may have similar doping profiles to the corresponding regions in FIG. 1 and may have an extent along the major surface 2a similar to the thicknesses of the corresponding regions shown in FIG. 1 except that in the case of the lateral device 1c shown in FIG. 6 the 'length' 1 (equivalent to 1b thickness in FIG. 1) of the drift region 3 may need to be reduced to achieve a reasonable packing density. Typically, the drift region 3 may in this example have a 'length' e.g. 40 µm with a buffer relatively highly doped region 3a (indicated by dashed lines in FIG. 6) extending for a distance of 2 µm around the injection region 8a for a device 1c with a reverse voltage blocking capability of 50 OV. To increase the reverse voltage blocking capability using the RESURF (REduced SURface Field) principle described by J. A. Appels et al in Philips Journal of Research, Vol. 35, No. 1980 at pages 1–13, the relatively lowly doped third subsidiary region 4c may be extended (as shown in dashed lines in FIG. 6) to meet the substrate 20. Also in accordance with conventional DMOS technology, the electrical shorting by the second main electrode 12 of the third region 6 and the second region 4 may alternatively be accomplished by etching a moat through the third region to expose an underlying portion of the second region 4.

Figure 7:
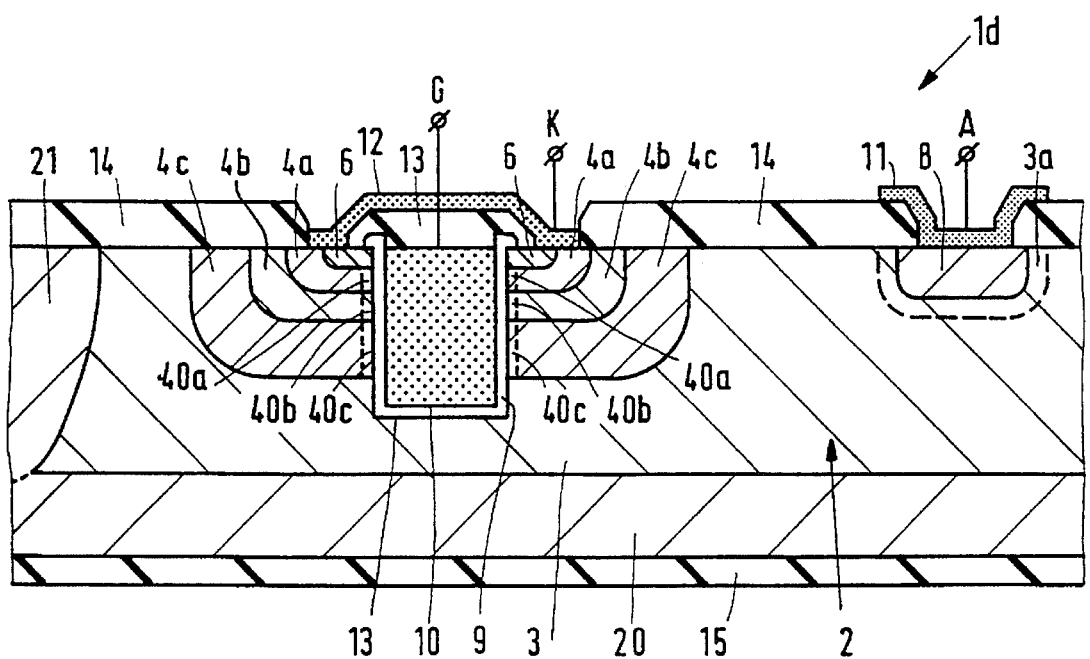
FIG. 7 is a schematic cross-sectional through part of a fourth embodiment of a semiconductor device comprising an insulated gate field effect device in accordance with the invention.

FIG. 7 illustrates a modification 1d of the device 1c where the planar technology has been replaced by a trench type of technology to produce a device 1d which is a lateral version of the device 1a. As can be seen from a comparison of FIGS. 1 and 7, FIG. 7 differs from FIG. 1 in that the first, second and third subsidiary regions 4a, 4b and 4a are formed as planar discrete regions (as in the example shown in FIG. 5) through which the groove 14 extends. As in FIG. 1, it is the thicknesses or depths of these regions rather than their lateral extents which define the conduction channel area. Such a trench lateral device id should allow for a greater packing density than the DMOS type lateral device 1c shown in FIG. 6.

It should be noted that the vertical trench device 1a has advantages over the vertical DMOS device 1b while the lateral DMOS device 1c has advantages over the lateral trench device 1d.

Thus, both the vertical trench structure device 1a and the lateral DMOS type structure device 1c provide for a conduction channel which is generally parallel to the thyristor conduction path so allowing for a greater proportion of the hole current to flow through the second subsidiary region 4b generally parallel to the inversion channel 40b than in the different geometry structures shown in FIGS. 5 and 7. Indeed, an increase the thickness second subsidiary region 4b may be desirable in the examples of FIGS. 5 and 7 to facilitate the rise of the hole quasi fermi potential in this region to 0.7 V above the quasi Fermi electron potential in the inversion channel 40b to initiate bipolar action.

Also, the examples illustrated in FIGS. 1 and 6 are relatively simple technologically to manufacture. In contrast, the examples illustrated in FIGS. 5 and 7 both require the formation of a relatively highly doped third subsidiary region 4c and a relatively lowly doped second subsidiary region 4b within that highly doped region. This may require the use of sophisticated implantation techniques to achieve a relatively high doping level at a desired depth below the semiconductor body surface 2a (for example as described in GB-A-1587773) or even the use of selective etching, implantation and selective epitaxial growth techniques.

Although in the examples described above, the present invention is applied to an enhancement mode device, that is a device in which the conduction channel is formed in the conduction channel areas 40a, 40b, 40c as an inversion channel by the application of an appropriate polarity first voltage to the insulated gate 9, 10, it should of course be appreciated that the present invention could be applied to a depletion mode device, that is to a device in which the conduction channel area 40a, 40b, 40c is of the one conductivity type (n conductivity type where the second region is of p conductivity type) to provide conduction channel when the gate voltage is zero and in which the conduction channel is removed by the application of an appropriate polarity first voltage to the insulated gate 9, 10. The conduction channel area of such a depletion mode device could be formed by ion implantation through the surface at which the insulated gate 9, 10 is to be formed.

Although the present invention has been described with reference to and is primarily intended for an IGBT-like structure, it may be possible to apply the present invention to a conventional MOS-like device, that is a device in which the third region 3 forms the source region, the first region 7 provides the drain drift regions and the at least one injector region 8 is omitted and replaced by a highly doped subsidiary region of the one conductivity type of the drain region. The device structure and doping concentrations should be such that the opposite conductivity type carrier (holes in the case of an n-channel MOS) leakage current across the pn junction 5 is sufficient to enable the pn junction 40b' to become forward-biassed as the drain voltage rises to turn on the bipolar transistor formed by the second subsidiary channel, the second subsidiary region 4b and the drain region. Such a device would initially act as a MOS transistor but with sufficiently high drain voltage would then function as a bipolar transistor which bipolar transistor could then be switched off easily by removal of the conduction channel.

It should of course be appreciated that other grooved gate (for example the so-called VMOS or UMOS) technologies may be used in place of the so-called trench technology described here. Also, of course, the conductivity types described above could be reversed to enable the formation of p-channel devices. This would of course require appropriate changes in the polarity of applied voltages during operation of the device.

The present invention could be applied to semiconductor materials other than silicon, for example III–V materials or combinations of different semiconductor materials.

From reading the present disclosure, other modifications and variations will be apparent to persons skilled in the art. Such modifications and variations may involve other features which are already known in the semiconductor art and which may be used instead of or in addition to features already described herein.

We claim:

1. A semiconductor device comprising an insulated gate field effect device having a semiconductor body comprising a first region of one conductivity type, a second region of the opposite conductivity type forming a first pn junction with the first region, a third region of the one conductivity type forming a second pn junction with the second region and being separated from the first region by the second region, at least one injector region for injecting charge carriers of the opposite conductivity type into the first region, an insulated gate, a conduction channel area within the second region and adjoining the insulated gate, which conduction channel area is gateable by the insulated gate between a first state in which a conduction channel of the one conductivity type provides a conductive path for the flow of charge carriers of the one conductivity type between the first and third regions and a second state in which the conduction channel is removed, the device being such that initiation of thyristor action by the transistors formed by the first, second and third regions, and the injector, first and second regions, is inhibited, wherein the conduction channel area comprises first and second subsidiary conduction channel areas for providing respective first and second subsidiary conduction channels in the first state of the conduction channel area, the second region comprising first and second subsidiary regions for providing the first and second subsidiary conduction channel areas, the second subsidiary conduction channel area being spaced from the third region by the first subsidiary conduction channel area and being more lowly doped than the first subsidiary conduction channel area for causing, when the current resulting from the injection of charge carriers of the opposite conductivity type by the at least one injector region reaches a given value in operation of the device, the pn junction between the second subsidiary conduction channel and the second region to become forward biassed causing the bipolar transistor formed by the second subsidiary conduction channel, the second region and the first region to conduct to initiate with the at least one injector region thyristor action which ceases upon removal of the conduction channel, and wherein the second subsidiary region is separated from the first region by a third subsidiary region of the second region, which third subsidiary region is more highly doped than the second subsidiary region.

2. A semiconductor device according to claim 1, wherein the second region comprises first and second subsidiary regions adjoining the insulated gate for providing the first and second conduction channel areas in which respective first and second subsidiary inversion channels are formed in the first state of the conduction channel area.

3. A semiconductor device according to claim 1, wherein the third region is electrically shorted to the second region.

4. A semiconductor device according to claim 1, wherein the third and injector regions meet a first one of first and second major surfaces of the semiconductor body.

5. A semiconductor device according to claim 1, wherein the third and injector regions meet respective ones of first and second major surfaces of the semiconductor body.

6. A semiconductor device according to claim 1, wherein the second and third pn junctions meet a first one of two opposed major surfaces of the semiconductor body so that the conduction channel area adjoins the first major surface and the insulated gate structure extends on the first major surface over the conduction channel area.

7. A semiconductor device according to claim 1, wherein the third region meets a first one of two opposed major surfaces of the semiconductor body and the insulated gate structure is formed within a groove extending from the first major surface through the third and second regions into the first region.

8. A semiconductor device comprising an insulated gate field effect device having a semiconductor body comprising a first region of one conductivity type, a second region of the opposite conductivity type forming a first pn junction with the first region, a third region of the one conductivity type forming a second pn junction with the second region and being separated from the first region by the second region, an insulated gate, a conduction channel area within the second region and adjoining the insulated gate, which conduction channel area is gateable by the insulated gate between a first state in which a conduction channel of the one conductivity type provides a conductive path for the flow of charge carriers of the one conductivity type between the first and second regions and a second state in which the conduction channel is removed, the device being such that initiation of bipolar transistor action by the first, second and third regions is inhibited, wherein the conduction channel area comprises first and second subsidiary conduction channel areas for providing respective first and second subsidiary conduction channels in the first state of the conduction channel area, the second region comprising first and second subsidiary regions for providing the first and second subsidiary conduction channel areas, the second subsidiary conduction channel area being spaced from the third region by the first subsidiary conduction channel area and being more lowly doped than the first subsidiary conduction channel area for causing, when a leakage current of charge carriers of the opposite conductivity type across the first pn junction reaches a given value in operation of the device, the pn junction between the second subsidiary conduction channel and the second region to become forward-biassed causing the bipolar transistor formed by the second subsidiary conduction channel, the second region and the first region to conduct to initiate bipolar transistor action which ceases upon removal of the conduction channel, and wherein the second subsidiary region is separated from the first region by a third subsidiary region of the second region, which third subsidiary region is more highly doped than the second subsidiary region.

9. A semiconductor device according to claim 8, wherein the second region comprises first and second subsidiary regions adjoining the insulated gate for providing the first and second conduction channel areas in which respective first and second subsidiary inversion channels are formed in the first state of the conduction channel area.

10. A semiconductor device according to claim 8, wherein the third region is electrically shorted to the second region.

11. A semiconductor device according to claim 8, wherein the third and first regions meet a first one of first and second major surfaces of the semiconductor body.

12. A semiconductor device according to claim 8, wherein the third and first regions meet respective ones of first and second major surfaces of the semiconductor body.

13. A semiconductor device according to claim 8, wherein the second and third pn junctions meet a first one of two opposed major surfaces of the semiconductor body so that the conduction channel area adjoins the first major surface and the insulated gate structure extends on the first major surface over the conduction channel area.

14. A semiconductor device according to claim 8, wherein the third region meets a first one of two opposed major surfaces of the semiconductor body and the insulated gate structure is formed within a groove extending from the first major surface.

* * * * *